US006566967B1

United States Patent
Anumula et al.

(10) Patent No.: US 6,566,967 B1
(45) Date of Patent: May 20, 2003

(54) CONFIGURABLE TRIPLE PHASE-LOCKED LOOP CIRCUIT AND METHOD

(75) Inventors: Sudhaker Reddy Anumula, San Diego, CA (US); Joseph J. Balardeta, Carlsbad, CA (US); Wei Fu, San Diego, CA (US); Paul Vanderbilt, Encinitas, CA (US); Mehmet Mustafa Eker, Santee, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/085,458

(22) Filed: Feb. 26, 2002

(51) Int. Cl.[7] .................................................. H03L 7/00
(52) U.S. Cl. ........................................................ 331/11
(58) Field of Search ................................ 331/10, 11, 17, 331/25; 327/99, 407, 46

(56) References Cited

U.S. PATENT DOCUMENTS 5,486,792 A * 1/1996 Girardeau, Jr. ............... 331/10
5,910,753 A * 6/1999 Bogdan ......................... 331/17
5,936,565 A * 8/1999 Bogdan ....................... 341/152
6,075,416 A * 6/2000 Dalmia ......................... 331/25
6,198,355 B1 * 3/2001 Lindquist et al. ............. 331/27
6,310,521 B1 * 10/2001 Dalmia ......................... 331/11
6,407,642 B2 * 6/2002 Dosho et al. ................. 331/11

* cited by examiner

Primary Examiner—My-Trang Nu Ton
(74) Attorney, Agent, or Firm—Gray Cary Ware & Freidenrich; Terrence A. Meador

(57) ABSTRACT

A configurable PLL architecture having multiple detection elements. The configurable PLL circuit includes a first detector for providing a first differential signal, a second detector for providing a second differential signal, a third detector for providing a third differential signal, and a selection circuit for enabling at least one of the first, second and third detectors. The PLL circuit also includes a multiplexer for receiving at least one differential signal from a corresponding enabled detector, and for providing a multiplexed differential signal output. In operation, an operating mode is selected, and one or more detectors are enabled for operation with one or more input reference signals. The outputs of the enabled detectors is received by the multiplexer to complete the operation of the selected operating mode.

25 Claims, 2 Drawing Sheets

CONFIGURABLE TRIPLE PHASE-LOCKED LOOP CIRCUIT AND METHOD

BACKGROUND OF THE INVENTION

The present invention relates generally to a configurable phase locked loop (PLL) architecture, and more particularly to an apparatus and method for using a PLL having various combinations of phase and frequency detectors and feedback loops.

A PLL is a feedback control system for automatically adjusting the phase and/or frequency of a locally generated signal to match the phase (and/or frequency) of an input signal. A typical PLL has three components: a detector for discerning a difference in phase and/or frequency between the local feedback signal and the input signal; a filter for filtering unwanted harmonics or frequencies from the detector output; and a voltage controlled oscillator (VCO). The output of the VCO provides the local feedback signal. The detector will "lock" the output frequency of the VCO to the frequency of the input signal by causing the VCO to correct itself.

Some conventional PLL circuits either use a combination of a phase-frequency detector (PFD) and a phase detector (PD), or a combination of a bang-bang PFD and a phase detector (PD) for clock and data recovery applications. However, even these PLL architectures provide limited configuration options. For instance, clock and data recovery applications are limited to an operation in which the PLL achieves lock first using a PFD, and then uses a PD for actual clock and data recovery. Conventional dual loop architectures present limited options in the loop designs and not flexible to suit different applications needed in clock recovery and synthesis. Employing multiple PLL circuits to accomplish many different applications consumes critical space on a semiconductor device.

DETAILED DESCRIPTION OF THE PREFERRED EMBODIMENTS

Figure 1:
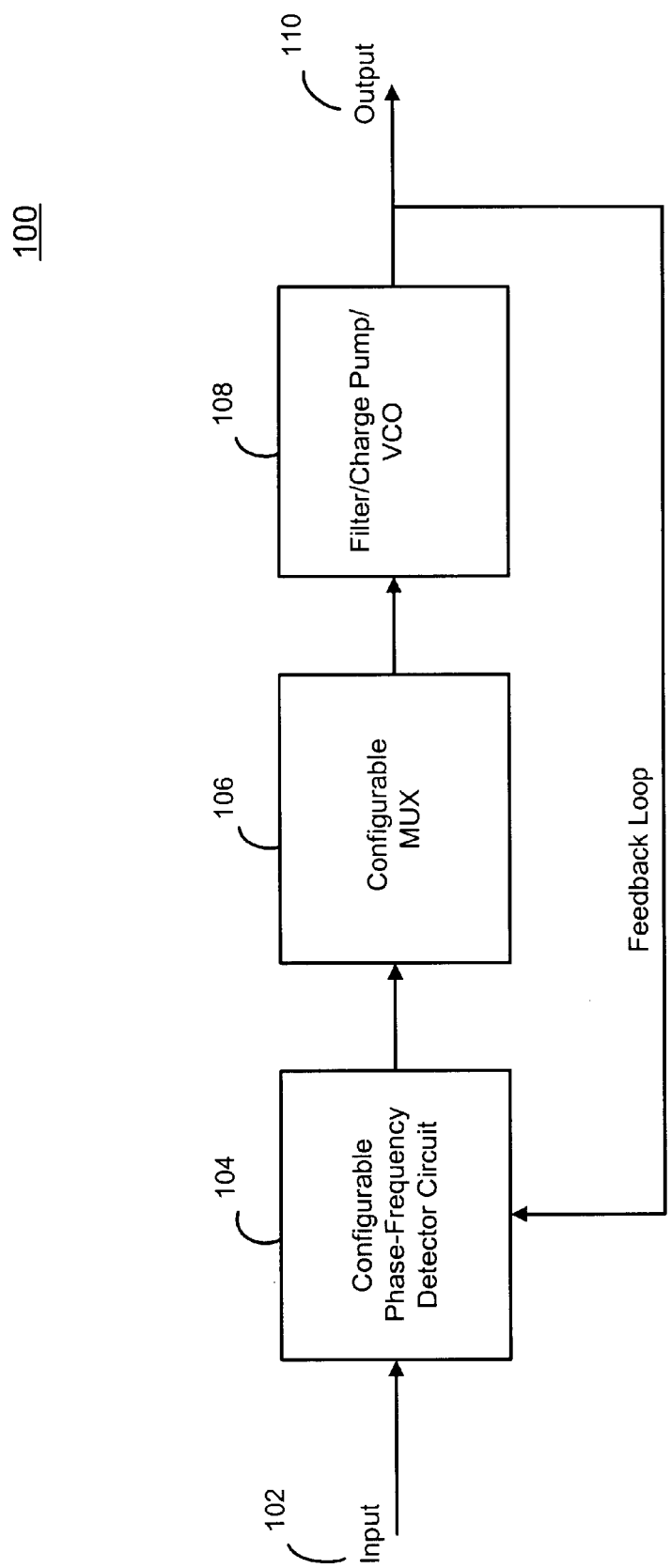
FIG. 1 is a simplified block diagram of a PLL circuit according to the invention.

The PLL according to this invention uses a multiple loop architecture to exercise different loop options to achieve optimum performance for clock & data recovery and clock synthesis applications.

In one example of the invention, a PLL circuit includes a triple-phase/frequency detector-based feedback architecture. The triple-loop PLL architecture allows configuration of the loop for multiple options using a combination of a phase-frequency detector (PFD), a phase detector (PD) and bang bang PFD (BBPFD). The PD preferably has a linear transfer function, whereas the BBPFD is so-called due to its binary or step transfer function. This embodiment exercises different loop options with a select-signal control scheme to achieve optimum performance for different phase locked-loop applications and operation modes, and to achieve jitter requirements.

According to one embodiment, a configurable detection circuit for a PLL includes a first detector, a second detector, and a third detector. The numerical designation of the detectors is merely for identification, and it is not intended to impart precedence, importance, structural or other limitations. Each detector provides a particular differential signal representing an error or difference between the phase and/or frequency of an input signal and a local feedback signal. The detection circuit further includes a selection circuit for enabling at least one of the first, second and third detectors, and a multiplexer for receiving a differential signal from a corresponding at least one enabled detector, and for providing a multiplexed differential signal output.

According to another embodiment of the invention, a multiple-loop PLL circuit includes a configurable multiplexer having a plurality of selectable inputs. One preferred type of multiplexer suitable for use with the present invention is disclosed in U.S. patent application No. 10/085,613, Configurable Multiplexing Circuit and Method," assigned to Applied Micro Circuits Corp. of San Diego, Calif., the assignees of this invention, the contents of which are incorporated by reference herein for all purposes.

The multi-loop PLL circuit further includes a filter/charge pump having an input connected to an output of the multiplexer, and a voltage controlled oscillator (VCO) having an input connected to an output of the filter/charge pump. The circuit includes a first feedback loop including a phase frequency detector (PFD) having a first input connected to a reference clock input and a second input connected to a first output of the VCO, and an output connected to a first selectable input of the multiplexer. The circuit also includes a second feedback loop including a bang-bang PFD (BBPFD), a first switch, and a second switch, the BBPFD having a first input connected to an output of the first switch, a second input connected to an output of the second switch, and an output connected to a second selectable input of the multiplexer, the first switch having a first input connected to the first output of the VCO and a second input connected a second output of the VCO, and the second switch having a first input connected to the reference clock input and a second input connected to a receive signal input. The circuit further includes a third feedback loop including a phase detector (PD), the second switch, and a third switch, the PD having a first input connected to the output of the second switch, a second input connected to an output of the third switch, and an output connected to a third selectable input of the multiplexer, the third switch having a first input connected to the first output of the VCO and a second input connected a second output of the VCO. The circuit further includes a selection circuit connected to the multiplexer, the PFD, the BBPFD, the PD, the first switch, the second switch, and the third switch, by which to enable the feedback loops and associated inputs.

In yet another embodiment of the invention, a method of configuring a multi-mode PLL includes the steps of selecting an operating mode from a plurality of operating modes, enabling one or more detection elements to determine a difference between a selected one of a plurality of PLL feedback signals and a selected one of a plurality of reference signals according to the selected operating mode, and configuring one or more of a plurality of input paths to a multiplexer to receive an output of each enabled detection element according to the selected operating mode.

This invention includes a flexible phase locked loop architecture that is easily configured for different customer specifications/product applications. Since the invention avoids complex switching structures, it can be embodied in a system that uses less area on a chip, and achieves higher functionality and integration. Additionally, the invention provides a simple select control scheme to configure different options for the phase locked loop systems and optimize the power & jitter performance requirements, i.e., jitter generation, jitter tolerance and jitter transfer.

FIG. 1 shows a simplified block diagram of a multi-phase locked loop circuit 100. Single-line connection is shown instead of differential line connections, for sake of clarity and simplicity. The circuit 100 generally includes a signal input 102 to a configurable phase/frequency detector circuit 104. The configurable phase/frequency detector circuit, as will be described below, preferably includes a combination of detectors, each being individually configurable for executing various detection operations based on a particular operating mode.

The output of the configurable phase/frequency detector circuit 104 is provided to an input to a configurable multiplexer (CMUX) 106. The CMUX and its input can also be configurable for receiving and multiplexing the output of the configurable phase/frequency detector circuit 104 based on the operating mode. The output from the CMUX is provided to an input of a filter/charge pump/voltage controlled oscillator (VCO) circuit 108. The CMUX output controls the VCO frequency, and the VCO circuit 108 output is provided back to the configurable phase/frequency detector circuit 104 along one or more feedback paths.

Figure 2:
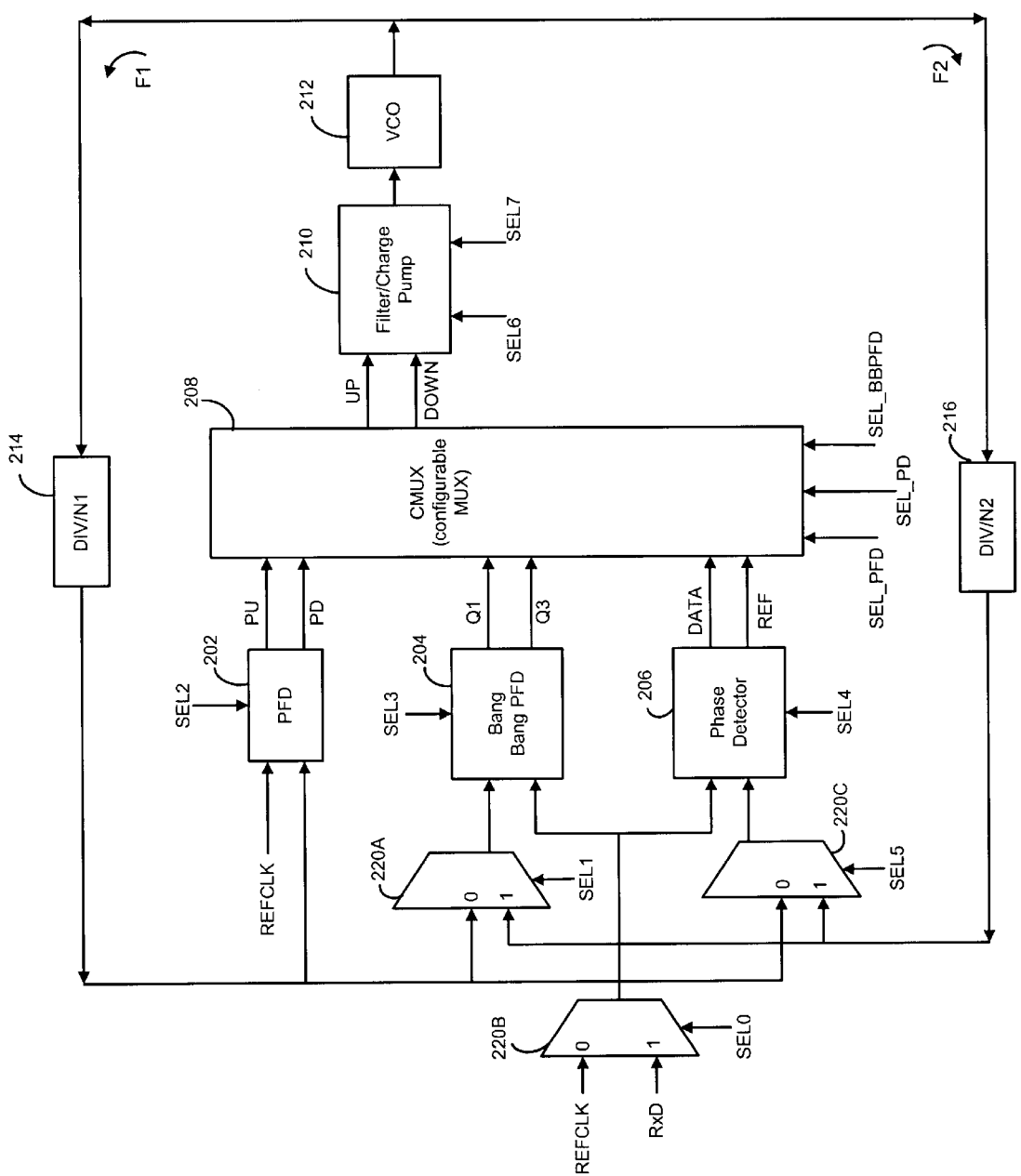
FIG. 2 is a block diagram of an exemplary embodiment of a configurable PLL circuit having multiple phase and frequency detectors, according to the invention.

FIG. 2 illustrates a specific embodiment of a configurable phase locked loop (PLL) circuit 200 according to the invention. In this embodiment, the PLL circuit 200 includes three detectors in a triple-loop architecture. Those having skill in the art would recognize that this embodiment is described merely as an example, and a PLL circuit may include other numbers and combinations of detectors and feedback loops within the scope of this invention.

The PLL circuit 200 of the embodiment includes a first detector 202, a second detector 204, and a third detector 206. In a specific embodiment, the first detector 202 is a phase frequency detector (PFD), the second detector 204 is a bang bang (i.e. binary) phase frequency detector (BBPFD), and the third detector 206 is a phase detector (PD), such as a Hogge-type (i.e. linear) PD, for example. The outputs of each of the detectors 202, 204, and 206 are connected to respective inputs of a configurable multiplexing circuit (CMUX) 208. The outputs of the CMUX 208 are connected to inputs of a filter/charge pump 210, which has an output connected to an input of a voltage controlled oscillator (VCO) 212.

The output of the VCO 212 is provided to at least two feedback loops F1 and F2 and back to inputs of the detectors 202, 204, and 206. One or more switches can be used at inputs to the detectors 202, 204, 206 for selectively enabling a particular input signal. For example, switch 220A is used to select an input to the BBPFD 204 from either feedback loop F1 or feedback loop F2. Switch 220B is used to select either external input REFCLK or RxD for the BBPFD 204 and/or PD 206. Switch 220C is used to select an input to the PD 206 from either feedback loop F1 or F2. The feedback loops F1 and F2 each may include a divider circuit for dividing down the frequency by a predetermined denominator, such as DIV/N1 circuit 214 and DIV/N2 circuit 216. The switches 220A, 220B and 220C comprise a portion of a selection circuit,;which includes a network of detector select inputs SEL0, SEL1, SEL2, SEL3, SEL4, and SEL5 and CMUX select inputs SEL_PFD, SEL_PD, SEL_BBPFD.

The circuit 200 includes external inputs reference clock REFCLK and receive data RxD. A configuration of the loop is achieved by selecting an operating mode from a plurality of operating modes, and providing select signals on select inputs SEL_PFD, SEL-BBPFD, SEL_PD, SEL0, SEL1, SEL2, SEL3, SEL4 according to the selected operating mode. SEL0, SEL1 and SEL5 are used for controlling the operation of the switches 220B, 220A and 220C, respectively. With reference to FIG. 2, a LOW signal on select inputs SEL0, SEL1 or SEL5 enables the "0" input, and a HIGH signal enables the "1" input. Other select inputs SEL6 and SEL7 are used to control the attenuation of the filter in the filter/charge pump 210. The outputs from the PFD 202, the BBPFD 204, and the PD 206 drive the CMUX 208. The select inputs SEL_PFD, SEL_BBPFD, SEL_PD enable the CMUX for operation with PFD 202, BBPFD 204, and/or PD 206, respectively. The outputs of the CMUX 208 (UP, DOWN) drive the filter/charge pump 210 and the phase locked loop circuit 200 into the steady state lock condition.

The selection circuit can be implemented with a microprocessor programmable register interface. Alternatively, the selection circuit can be implemented entirely as a computer software product or a hard-wired dedicated circuit such as an application specific integrated circuit (ASIC) or the like.

The PLL circuit 200 can be configured for one or more of a number of operating modes using select signals as described below. The operating modes below are described as exemplary only, and are not intended to be limiting in any way. Accordingly, other combinations of a selection circuit and selection signals to achieve a particular operating mode may still fall within the teachings of this invention. The mechanism for enabling and disabling select signals depends on the selected operating mode and the specific PLL application. The unselected portions of the circuit can be powered down to eliminate jitter feed-through and conserve power.

PLL Applications

Generally, the PFD 202 utilizes the feedback loop F1 with the divider N1 214 to accomplish frequency lock for a frequency acquisition application. The BBPFD 204 utilizes the feedback loop F1 with the divider N1 214, and necessary attenuation in the filter 210 (using select signal SEL6), for the loop for a clock synthesis application. Alternatively, the BBPFD 204 utilizes the loop with the divider N2 216, and the necessary attenuation in the filter (using select signal SEL7), for the feedback loop F2 for a clock recovery application. The PD 206 utilizes the feedback loop F1 with the divider N1 214 for a clock synthesis application, and the PD 206 utilizes the feedback loop F2 with the divider N2 F2 for a clock recovery application.

PLL Operating Modes

With the foregoing in mind, and with continued reference to the PLL circuit shown in FIG. 2, attention is now turned to a number of various operating modes that may be selected for accomplishing a specific application.

Clock Synthesis Mode Using PFD.

The external input is REFCLK for the PFD 202. The PLL circuit 200 is configured for a clock synthesis application using the PFD 202 by enabling select signals SEL2 and SEL_PFD. This mode is suitable for applications that require lower power, medium jitter generation, and where the reference clock has a high duty cycle distortion.

Clock Synthesis Mode Using PFD and PD.

The external input is REFCLK for the PFD 202 and PD 206. The PLL circuit 200 is configured for a clock synthesis application using the PFD 202 and PD 206. The select signals SEL_PFD and SEL2 are enabled to use the PFD 202 to achieve frequency lock, and then the PD 206 and associated path is selected by enabling the SEL0(=LOW), SEL5 (=LOW), SEL4, and SEL_PD select signals, and disabling the PFD 202 and BBPFD 206 and associated paths at the CMUX 208. This mode is suitable for applications requiring medium power, lower jitter generation and higher noise rejection.

Clock Synthesis Mode Using PFD and BBPFD.

The external input is REFCLK for the PFD 202 and the BBPFD 204. The. PLL circuit 200 is configured for a clock synthesis application using the PFD 202 and the BBPFD 204. The select signals SEL_PFD and SEL2 are enabled to use the PFD 202 to achieve frequency lock, and then the BBPFD 204 and associated path is selected by enabling the SEL0(=LOW), SEL1(=LOW), and SEL_BBPFD select signals and disabling the PFD 202 and the PD 206 and their paths at the CMUX 208. This mode is suitable for applications requiring lower to medium power, medium jitter generation and higher noise rejection.

Clock & Data Recovery Mode Using PFD and PD.

The external input is REFCLK for the PFD 202 and RxD for the PD 206. The PLL circuit 200 is configured for a clock and data recovery application using the PFD 202 and the PD 206. The select signals SEL_PFD and SEL2 are enabled to use the PFD 202 to achieve frequency lock, and then the PD. 206 path is selected by enabling the SEL0(=HIGH), SEL5 (=HIGH), SEL4, and SEL_PD select signals and de-selecting the PFD and BBPFD and their paths at the CMUX 208. The clock recovery is accomplished by the PD 206 from RxD data. This mode is suitable for applications requiring medium power, lower jitter generation, higher jitter tolerance, and noise rejection. This mode also has superior jitter transfer characteristics.

Clock & Data Recovery Mode Using PFD and BBPFD.

The external input is REFCLK for the PFD 202 and RxD for the BBPFD 204. The PLL circuit 200 is configured for a clock and data recovery application using the PFD 202 and the BBPFD 204. The select signals SEL_PFD and SEL2 are enabled to use the PFD 202 to achieve frequency lock, and then the BBPFD 204 and its path are selected by enabling SEL0(=HIGH), SEL1(=HIGH), SEL3 and SEL_BBPFD select signals and de-selecting the PFD 202 and PD 206 and their paths at the CMUX 208. The clock recovery is accomplished by the BBPFD from the RxD data. This mode is suitable for applications requiring lower to medium power, medium jitter generation, medium jitter tolerance, and higher noise rejection.

Clock Synthesis Mode using BBPFD.

The exterinal input is REFCLK for the BBPFD 204. The PLL circuit 200 is configured for a clock synthesis application using the BBPFD 204. The select signals SEL0(=LOW), SEL1(=LOW), SEL3 and SEL_BBPFD are enabled to use the BBPFD 204 to achieve frequency lock and to then accomplish clock synthesis. The PFD 202 and PD 206 and their paths are deselected at the CMUX 208. This mode is suitable for applications requiring faster lock acquisition, lower power, medium jitter generation and higher noise rejection.

Clock and Data Recovery Mode using BBPFD.

The external input is RxD for the BBPFD 204. The loop is configured for a clock and data recovery application using BBPFD 204. The select signals SEL0(=HIGH), SEL_BBPFD, SEL3, and SEL1(=HIGH) are enabled to use BBPFD 204 to achieve frequency lock and perform clock recovery from the RxD data. The PFD 202 and PD 206 paths are de-selected at the CMUX 208. This mode is suitable for applications requiring faster lock acquisition without a reference clock. This mode is also suitable for applications requiring lower power, medium jitter generation, medium jitter tolerance, and higher noise rejection.

Clock Synthesis mode using BBPFD and PD.

The external input is REFCLK for both the BBPFD 204. and the PD 206. The PLL circuit 200 is configured for a clock synthesis application using the BBPFD 204 and PD 206. The select signals SEL0(=LOW), SEL_BBPFD, SEL3, and SEL1(=LOW) are enabled to use the BBPFD 204 to achieve frequency lock, and then the PD 206 is selected by enabling the SEL0(=LOW), SEL5(=LOW), SEL_PD and SEL4 select signals, and de-selecting the PFD 202 and BBPFD 204 paths at the CMUX 208. This mode is suitable for applications requiring faster lock acquisition, lower power, lower jitter generation, and higher noise rejection.

Clock and Data Recovery Mode Using BBPFD and PD.

The external input is RxD for both the BBPFD 204 and the PD 206. The PLL circuit 200 is then configured for clock and data recovery application using the BBPFD 204 and the PD 206. The select signals SEL0(=HIGH) and SEL1 (=HIGH), SEL_BBPFD, and SEL3 are enabled to use the BBPFD 204 to achieve frequency lock, and to extract clock data from RxD data, and then the PD 206 and its path are selected after frequency lock by enabling SEL0(=HIGH), SEL5(=HIGH), SEL4, and SEL_PD select signals, and de-selecting the PFD 202 and the BBPFD 204 paths at the CMUX 208. The clock recovery control is transferred to the PD 206 path. This mode is suitable for applications requiring faster lock acquisition. This mode is also suitable in application without a reference clock, and for lower jitter generation, higher jitter tolerance and noise rejection. This mode has superior jitter transfer characteristics.

It is to be understood that the above is merely a description of preferred embodiments of the invention and that various changes, alterations, and variations may be made without departing from the true spirit and scope of the invention as set forth in the appended claims. None of the terms or phrases in the specification and claims has been given any special particular meaning different from the plain language meaning to those skilled in the art, and therefore the specification is not to be used to define terms in an unduly narrow sense.

What is claimed is:

1. A configurable detection circuit for a phase locked loop (PLL), comprising:
    a first detector for providing a first differential signal;
    a second detector for providing a second differential signal;
    a third detector for providing a third differential signal;
    a selection circuit for enabling at least one of the first, second and third detectors; and
    a multiplexer for receiving the differential signal from a corresponding enabled detector, and for providing a multiplexed differential signal output.

2. The circuit of claim 1, wherein the first detector is a phase frequency detector, and the first differential signal represents a phase and/or frequency difference between a first PLL feedback signal and a reference clock signal.

3. The circuit of claim 1, wherein the second detector is a bang-bang phase frequency detector, and the second differential signal represents phase and/or frequency difference between a selected one of a first PLL feedback signal or a second PLL feedback signal and a selected one of the reference clock signal or a receive signal.

4. The circuit of claim 1, wherein the third detector is a phase detector, and the third differential signal includes a detected phase difference between a selected one of a first PILL feedback signal or a second PLL feedback signal and a selected one of a reference clock signal or a receive signal.

5. The circuit of claim 1, wherein the first detector is a phase frequency detector, the second detector is a bang bang phase frequency detector, and the third detector is a phase detector.

6. The circuit of claim 5, wherein the first differential signal includes a detected phase and/or frequency difference between a first PLL feedback signal and a reference clock signal, the second differential signal includes a detected phase and/or frequency difference between a selected one of the first PLL feedback signal or a second PLL feedback signal and a selected one of the reference clock signal or a receive signal, and the third differential signal includes a detected phase difference between a selected one of the first PLL feedback signal or the second PLL feedback signal and a selected one of the reference clock signal or the receive signal.

7. The circuit of claim 1, wherein the selection circuit includes a first selection input set for activating one or more inputs to the multiplexer.

8. The circuit of claim 7, wherein the selection circuit further includes a second selection input set for enabling the first detector, the second detector, and/or third detector.

9. The circuit of claim 8, wherein the first detector is a phase frequency detector, the second detector is a bang bang phase frequency detector, and the third detector is a phase detector.

10. The circuit of claim 9:
wherein the first differential signal includes a detected phase and/or frequency difference between a first PLL feedback signal and a reference clock signal, the second differential signal includes a detected phase and/or frequency difference between a selected one of a first PLL feedback signal or a second PLL feedback signal and a selected one of the reference clock signal or a receive signal, and the third differential signal includes a detected phase difference between a selected one of the first PLL feedback signal or the second PLL feedback signal and a selected one of the reference clock signal or the receive signal; and
wherein the second selection input set is further configured to enable receipt of the first PLL feedback signal or the second PLL feedback signal, and to enable receipt of the reference clock signal or the receive signal.

11. A multiple-loop phase locked loop (PLL) circuit, comprising:
a multiplexer having a plurality of selectable inputs;
a filter/charge pump having an input connected to an output of the multiplexer;
a voltage controlled oscillator (VCO) having an input connected to an output of the filter/charge pump; and
a first feedback loop including a phase frequency detector (PFD) having a first input connected to a reference clock input and a second input connected to a first output of the VCO, and an output connected to a first selectable input of the multiplexer;
a second feedback loop including a bang-bang PFD (BBPFD), a first switch, and a second switch, the BBPFD having a first input connected to an output of the first switch, a second input connected to an output of the second switch, and an output connected to a second selectable input of the multiplexer, the first switch having a first input connected to the first output of the VCO and a second input connected a second output of the VCO, and the second switch having a first input connected to the reference clock input and a second input connected to a receive signal input;
a third feedback loop including a phase detector (PD), the second switch, and a third switch, the PD having a first input connected to the output of the second switch, a second input connected to an output of the third switch, and an output connected to a third selectable input of the multiplexer, the third switch having a first input connected to the first output of the VCO and a second input connected a second output of the VCO; and a
a selection circuit connected to the multiplexer, the PFD, the BBPFD, the PD, the first switch, the second switch, and the third switch.

12. The detector of claim 11, wherein the selection input further enables input of the first PLL feedback signal or the second PLL feedback signal to the BBPFD.

13. The circuit of claim 11, wherein the selection input further enables input of the reference clock signal or a receive signal to the BBPFD.

14. The circuit of claim 11, wherein the. selection input further enables input the first PLL feedback signal or the second PLL feedback signal to the PD.

15. The circuit of claim 11, wherein the selection input further enables input of the reference clock signal or the receive signal to the PD.

16. The circuit of claim 11, wherein comprising the multiplexer having a first input for receiving the output of the PFD, a second input for receiving the output of the BBPFD, and a third input for receiving the output of the PD.

17. The circuit of claim 16, wherein the selection input further enables input of the PFD output, the BBPFD output, and/or the PD output.

18. The circuit of claim 17, wherein the input of the PFD output, the BBPFD output, and/or the PD output corresponds to the selection of the first, second, and/or third paths.

19. The circuit of claim 11, wherein the first PLL feedback signal includes a voltage controlled oscillator (VCO) output signal passed through a first frequency divider.

20. The circuit of claim 11, wherein the second PLL feedback signal includes the VCO output passed through a second frequency divider.

21. A method of configuring a multi-mode phase locked loop (PLL), comprising:
selecting an operating mode from a plurality of operating modes;
enabling one or more detection elements to determine a difference between a selected one of a plurality of PLL feedback signals and a selected one of a plurality of reference signals according to the selected operating mode; and
configuring one or more of a plurality of input paths to a multiplexer to receive an output of each enabled detection element according to the selected operating mode.

22. The method of claim 21, wherein the detection elements include a phase frequency detector, a bang bang phase frequency detector, and a phase detector.

23. The method of claim 21, further comprising multiplexing the received output from each enabled detection element to produce a multiplexed differential signal output.

24. The method of claim 23, wherein the multiplexed differential signal output includes a DC voltage.

25. The method of claim 21, wherein the PLL feedback signals include an output from a voltage controlled oscillator (VCO).

* * * * *

UNITED STATES PATENT AND TRADEMARK OFFICE
CERTIFICATE OF CORRECTION

PATENT NO.   : 6,566,967 B1
DATED        : May 20, 2003
INVENTOR(S)  : Anumula et al.

It is certified that error appears in the above-identified patent and that said Letters Patent is hereby corrected as shown below:

Column 8,
Line 14, change "detector" to -- circuit --

Signed and Sealed this

Eighteenth Day of November, 2003

JAMES E. ROGAN
*Director of the United States Patent and Trademark Office*